(12) United States Patent
Chang et al.

(10) Patent No.: US 7,944,056 B2
(45) Date of Patent: *May 17, 2011

(54) HILLOCK-FREE ALUMINUM LAYER AND METHOD OF FORMING THE SAME

(75) Inventors: Kung-Hao Chang, Tainan County (TW); Shyi-Ming Yeh, Tainan County (TW); Jui-Tang Yin, Tainan County (TW)

(73) Assignee: Chimei Innolux Corporation, Chu-Nan, Miao-Li County (TW)

( * ) Notice: Subject to any disclaimer, the term of this patent is extended or adjusted under 35 U.S.C. 154(b) by 423 days.

This patent is subject to a terminal disclaimer.

(21) Appl. No.: 11/802,350

(22) Filed: May 22, 2007

(65) Prior Publication Data
US 2007/0224730 A1 Sep. 27, 2007

(30) Foreign Application Priority Data

Jul. 11, 2003 (TW) .............................. 92119085 A
Feb. 17, 2004 (TW) .............................. 93103832 A (51) Int. Cl.
 *H01L 23/48* (2006.01)
 *H01L 23/52* (2006.01)
 *H01L 29/40* (2006.01)
(52) U.S. Cl. .................................. 257/765; 257/771
(58) Field of Classification Search .................. 257/765, 257/771, 751, 767; 428/654, 650
See application file for complete search history.

(56) References Cited

U.S. PATENT DOCUMENTS

| 4,206,472 A * | 6/1980 | Chu et al. ...................... 257/486 |
| 5,518,805 A | 5/1996 | Ho et al. |
| 5,580,800 A | 12/1996 | Zhang et al. |
| 5,625,233 A * | 4/1997 | Cabral et al. ................... 257/771 |
| 5,825,437 A | 10/1998 | Seo et al. |
| 6,255,706 B1 | 7/2001 | Watanabe et al. |
| 6,348,403 B1 | 2/2002 | Raina et al. |
| 6,537,427 B1 | 3/2003 | Raina |
| 6,930,749 B2 * | 8/2005 | Lee et al. ...................... 349/187 |
| 7,220,599 B2 * | 5/2007 | Park et al. ......................... 438/3 |
| 7,235,310 B2 * | 6/2007 | Chang et al. .................. 428/654 |
| 7,304,331 B2 * | 12/2007 | Saito et al. .................... 257/192 |
| 2002/0119585 A1 * | 8/2002 | Yamazaki et al. .............. 438/29 |
| 2003/0068522 A1 | 4/2003 | Wang |
| 2003/0164350 A1 | 9/2003 | Hanson et al. |
| 2004/0140490 A1 | 7/2004 | Wang |
| 2005/0012126 A1 * | 1/2005 | Udayakumar et al. ......... 257/295 |
| 2005/0205911 A1 * | 9/2005 | Udayakumar et al. ......... 257/295 |
| 2008/0254613 A1 * | 10/2008 | Li et al. ......................... 438/624 |
| 2009/0072287 A1 * | 3/2009 | Noda .............................. 257/295 |

FOREIGN PATENT DOCUMENTS

| JP | 2000-208773 | 7/2000 |
| JP | 2002-368202 | 12/2002 |

* cited by examiner

*Primary Examiner* — S. V Clark
(74) *Attorney, Agent, or Firm* — Rabin & Berdo, PC (57) ABSTRACT

A hillock-free conductive layer comprising at least two aluminum (Al) layers formed on a substrate, wherein said at least two Al layers comprise a barrier Al layer formed on the substrate, and a pure Al layer formed on the barrier Al layer. The barrier Al layer could be an aluminum nitride (AlNx) layer, an aluminum oxide (AlOx) layer, an aluminum oxide-nitride (AlOxNy) layer, or an Al—Nd alloy layer. Also, the pure Al layer is physically thicker than the barrier Al layer, for effectively inhibiting the occurrence of hillocks and the like.

19 Claims, 3 Drawing Sheets

HILLOCK-FREE ALUMINUM LAYER AND METHOD OF FORMING THE SAME

This application claims the benefit of Taiwan applications Serial No. 092119085, filed Jul. 11, 2003, and Serial No. 093103832, filed Feb. 17, 2004, the subject matter of which is incorporated herein by reference.

BACKGROUND OF THE INVENTION

1. Field of the Invention

The invention relates in general to an aluminum (Al) conductive layer, and more particularly to a hillock-free Al layer and a method of forming the same.

2. Description of the Related Art

As the semiconductor manufacturing of an integrated circuit (IC) with larger scale is required, a substrate may be insufficient to provide an enough area for forming required interconnects for the IC. In order to meet the requirement of the formation of increased numbers of interconnects due to the reduction of metal oxide semiconductors (MOSs) of the IC in sizes, two or more levels of metal layers for interconnects have become a necessary technology adopted in the manufacturing of many ICs. Particularly, for some integrated circuits with sophisticated functions such as microprocessors, four or five levels of metal layers are required to implement interconnections of the components of the integrated circuits. On the other hand, in the manufacturing of a thin-film transistor liquid crystal display (TFT-LCD) panel, the metal films are employed as electrodes and interconnects, which are also formed in a structure with multiple layers of metal films.

In a structure with multiple layers of metal films, there are insulating layers, such as dielectrics, formed between any two of the metal layers in order to prevent an interlayer short circuit from occurring. In addition, a pure metal or an alloy with low electric resistance is suitably used as the material for the metal layers. In general, for examples of pure metals, Cr, Al, Cu, Mo, Ta, and W can be used. As examples of alloys with low electric resistance, an aluminum alloy containing one or more selected from the other elements, such as Al—Cu, Al—Cu—Si, Al—Pd, and Al—Nd, is used. Preferably, pure aluminum is employed as the material for metal layers. It is because aluminum has considerable adhesion with the substrate, and considerable etching characteristics in manufacturing as well as low electric resistivity. Besides, the earth contains much aluminum than other metal elements. Thus, aluminum is available and low in cost.

Figure 1A:
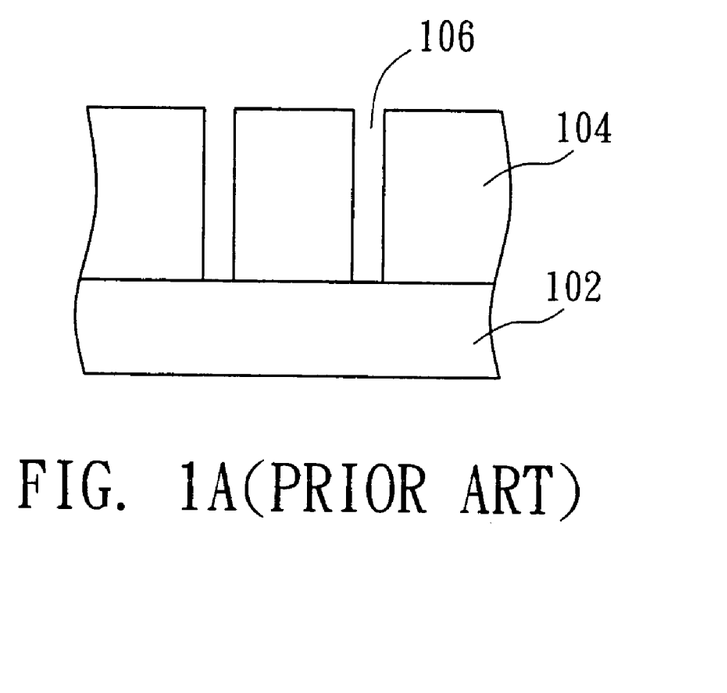
FIG. 1A (Prior Art) shows an example of the deposition of a metal on a glass plate.

However, it still has disadvantages to use pure aluminum, which has a melting point lower than other metals, as the element for metal layers. Referring to FIG. 1A, it illustrates the deposition of a metal on a glass plate. In the manufacturing of thin film transistors, firstly, grains 104 are formed on a glass plate 102 by the deposition of metal under relatively low temperature (about 150° C.) and grain boundaries 106 are formed between the grains. In fact, the grains will not formed regularly in the same way as shown in FIG. 1A and the regular grains shown in FIG. 1A are for the sake of illustration. Next, annealing is performed so that the increased vibration of the grains by heating at high temperature causes the re-arrangement of the atoms of the grains, thereby reducing defects of the grains and re-crystallizing the grains. After the re-crystallization, inner stress of the grains is rapidly reduced by the reduction of the density of defects such as dislocation. If the annealing temperature is being increased and raises the grains formed in the re-crystallization to a higher energy level exceeding the surface energy among the grains, the grains begin to grow while the smaller ones of them vanish. Consequently, the growth of the grains yields larger grains and the grain boundaries of the smaller grains vanish. Thus, the inner stress of the grains is further reduced to a lower level.

Figure 1B:
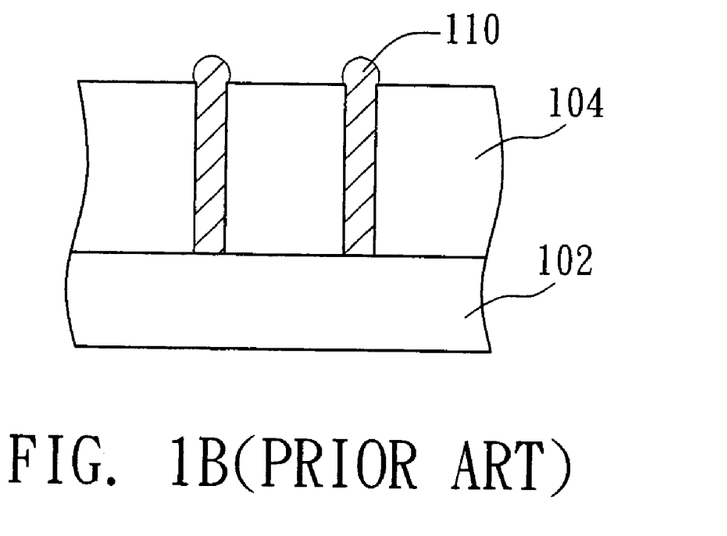
FIG. 1B (Prior Art) shows an example of hillocks which occur in an Al wiring layer formed on a glass plate after annealing.

When pure aluminum is used as the wiring layer material, hillock and the like may be produced. FIG. 1B shows the hillock by illustrating the glass plate with pure aluminum as the wiring layer material after annealing. In the annealing, the high temperature causes the thermal expansion of Al grain 104 and glass plate 102. Since aluminum has a greater thermal expansion coefficient than the glass, a substantial compressive stress by the Al grain 104 is applied to the glass plate 102. By this compressive stress, the aluminum atoms move along grain boundary 106 to cause a hillock 110. The hillock and the like, such as the hillock 110, may cause the unevenness of the thickness of the other layers in the subsequent fabrication process. Besides, in the worse case, an interlayer short circuit may occur when a large hillock penetrates an insulting layer (not shown) to be formed between the underlying metal layer and the overlying metal layer, and touches the overlying metal layer.

Figure 2A:
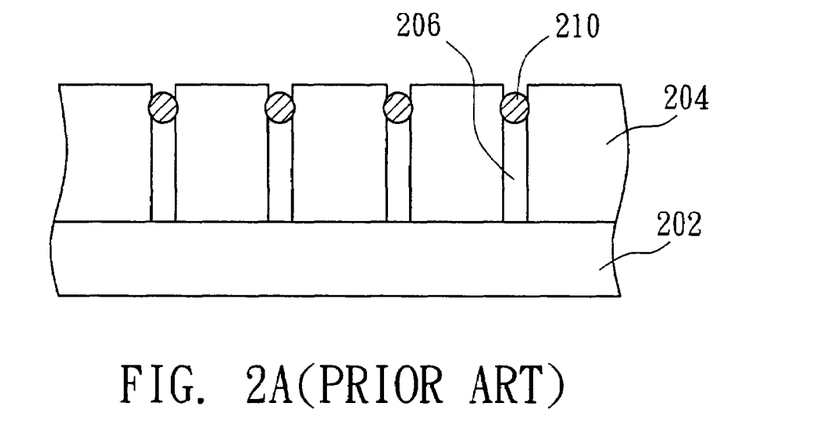
FIG. 2A (Prior Art) shows an example of grains of an Al alloy formed on a glass plate after annealing.

Hence, it is necessary to solve the problem of hillock in order to use Al as the wiring material. Conventionally, there are two approaches to this problem. The first approach is to use the other element having a high melting point, such as Nd, Ti, Zr, Ta, Si, and Cu, as the wiring material. FIG. 2A shows that grains 204 of an Al alloy formed on a glass plate 202 after annealing. As shown in FIG. 2A, there is no hillock formed among grain boundaries 206 of the grains 204 of the Al alloy. Since the atoms of the additional element of the Al alloy cannot dissolve in Al grains, as the grains 240 grow, the atoms of the additional element move to the grain boundaries 206 and gradually form small particles 210 among the grain boundaries 206. Thus, when Al atoms move along the grain boundaries 206, the small particles 210 hinder the Al atoms from moving above the grains 204, suppressing the formation of hillock.

Figure 2B:
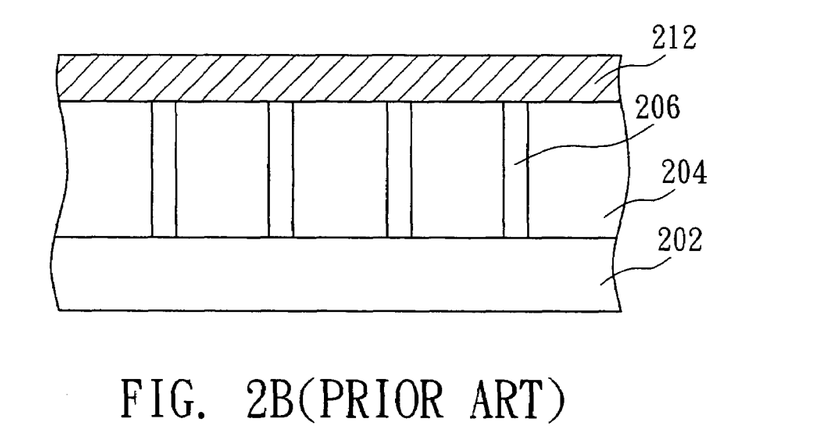
FIG. 2B (Prior Art) shows an example of a metal layer capping Al grains formed on a glass plate.
Figure 2C:
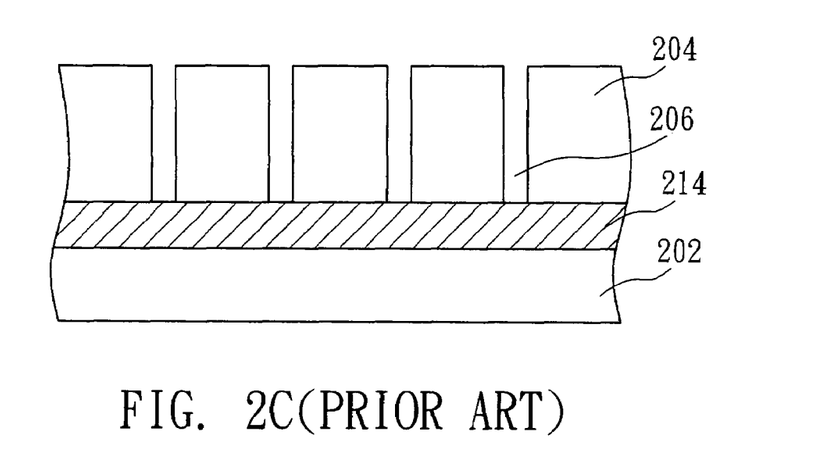
FIG. 2C (Prior Art) shows an example of a barrier metal layer sandwiched between a glass plate and Al grains.

The second approach is to form a metal layer with high melting point covering the Al grains so as to suppress the growth of hillock. FIG. 2B illustrates a metal layer capping the Al grains. After a metal layer 212 with a high melting point is plated over the Al grains 204, annealing is performed. Since the metal layer 212 works as caps for covering the exits formed by the grain boundaries 206 among the Al grains 204, Al atoms are blocked from forming hillocks along the grain boundaries 206. In addition, there is provided with a variant of the second approach where an Al layer in an amorphous phase is substituted for the metal layer 212. And Al layer in an amorphous state can be formed on the grains 204 for the suppression of the formation of hillock.

For these convention approaches to the problem of forming hillocks, it is the first one that is the most effective and usually employed. For example, a Japanese company, Kobelco, provides an Al—Nd alloy as the wiring material for metal layers, which is described in U.S. Pat. No. 6,033,542 to Yamamoto, et al. Nd has a large atomic weight and a high melting point, so that Nd can form small particles to hinder Al atoms from moving along the grain boundaries and forming hillocks. In this way, hillocks do not occur even if the temperature reaches 300° C. However, manufacturing cost is increased because Nd is a rare earth element, and it is required to apply a low sputtering rate in order to avoid splashing. Besides, Nd has a high resistivity so that an Al—Nd alloy has a resistivity higher than that of the pure aluminum.

As described above, the use of Al as wiring or electrode material in general semiconductor and liquid crystal display manufacturing is desired so that the study of the prevention of generating hillocks when Al is used therein is of great significant.

SUMMARY OF THE INVENTION

It is therefore an object of the invention to provide a conductive layer for preventing hillocks and method of forming the same. By using a barrier aluminum (Al) layer as the buffering layer, which thermal expansion coefficient of the barrier layer is between that of the pure Al layer and the substrate, the hillocks and the like are effectively prevented. Also, the resistance is low and the production cost is decreased.

The invention achieves the objects by providing a conductive layer for preventing hillocks comprising at least two aluminum (Al) layers formed on a substrate, wherein said at least two Al layers comprise: a barrier Al layer formed on the substrate, and a pure Al layer formed on the barrier Al layer. In the conductive layer of the invention, resistivity of the barrier Al layer is larger than resistivity of the pure Al layer. The pure Al layer is at least 99.0 wt %, and preferably at least 99.9 wt %. Also, thermal expansion coefficient of the barrier Al layer is smaller than thermal expansion coefficient of the pure Al layer.

The barrier Al layer could at least contain one compound of aluminum nitride (AlNx), aluminum oxide (AlOx) and aluminum oxide-nitride (AlOxNy). If the thickness ratio of the barrier Al layer to the pure Al layer is in the range between about 1:6.25 and 1:1, the hillocks and the like can be effectively inhibited. If the thickness ratio of the barrier Al layer to the pure Al layer is in the range between about 1:6.25 and 1:2, a good sectional profile after etching the device is obtained. The pure Al layer has a thickness ranged between about 1000 Å and 4500 Å.

Also, the barrier Al layer could be an Al—Nd alloy layer, wherein the Al—Nd alloy layer has a thickness ranged between about 100 Å and 4000 Å, and preferably in a thickness of about 300 Å and 900 Å. The pure Al layer has a thickness ranged between about 500 Å and 4500 Å, and preferably in a thickness of about 1500 Å and 3000 Å, and the thickness ratio of the Al—Nd alloy layer to the pure Al layer is in the range between about 1:6.67 and 1: 0.55.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 3:
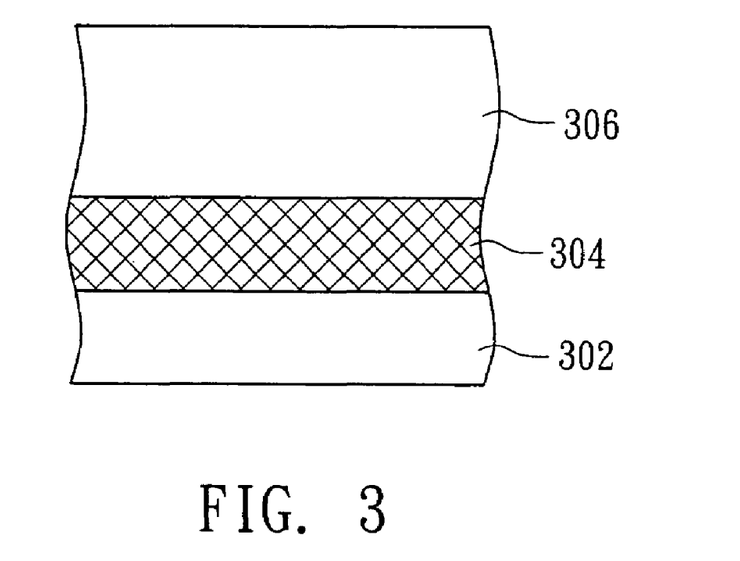
FIG. 3 shows a conductive layer with at least two aluminum layers on the substrate according to the embodiments of the present invention.

FIG. 3 shows a conductive layer with at least two aluminum layers on the substrate according to the embodiments of the present invention. A barrier aluminum (Al) layer 304 is formed on the substrate 302, and a pure Al layer 306 is then formed on the barrier Al layer 304, thereby inhibiting the occurrence of Al hillocks after undergoing the following thermal processes.

In the first embodiment, the barrier Al layer at least contains one compound of aluminum nitride (AlNx), aluminum oxide (AlOx) and aluminum oxide-nitride (AlOxNy). In the second embodiment, an aluminum-neodymium (Al—Nd) alloy is used as the material of the barrier Al layer for the specific study. The related experimental results are also disclosed hereby.

First Embodiment

Please also refer to FIG. 3. In the first embodiment, a glass substrate 304 is provided, and a barrier Al layer 304, such as an aluminum nitride (AlNX) layer, and aluminum oxide (AlOx) layer, an aluminum oxide-nitride (AlOxNy) layer, or any two or three layers combination thereof, is formed over the substrate 304. Then, a pure Al layer (at least 99.0 wt %, and preferably at least 99.9 wt %) 306 is formed over the barrier Al layer 304. According to the material of the barrier Al layer have been chosen, the thermal expansion coefficient of the barrier Al layer 304 is smaller than that (thermal expansion coefficient) of the pure Al layer 306, and larger than that of glass substrate 302. Therefore, the formation of Al hillocks can be successfully prevented after the device is exposed at a high temperature (or thermal shock) in the following processes. Also, resistivity of the barrier Al layer 304 is higher than that of the pure Al layer 306.

As shown in Table 1, the thermal expansion coefficients and resistivities of pure Al, AlNx, AlOx, AlOxNy and three different glass substrates before annealing are listed.

TABLE 1

| | Corning (glass substrate) | | NHT (glass substrate) | | Asahi (glass substrate) | Aluminum (Al) | aluminum nitride (AlN) | aluminum oxide (Al2O3) | aluminum oxide-nitride (AlOxNy) |
|---|---|---|---|---|---|---|---|---|---|
| Sample | 1737 | E2000 | NA35 | NA25 | NA30 | AN100 | | | |
| Thermal Expansion Coefficient ($\times 10^{-7}/\square$) | 37.8 | 32 | 37 | 26 | 32 | 38 | 231 | 45 | 81 | 45~81 |
| Resistivity ($\Omega$cm) | NA | NA | NA | NA | NA | NA | $2.65 \times 10^{-6}$ | $5.6 \times 10^{13}$ | $2 \times 10^{13}$ | $2 \times 10^{13}$~$5.6 \times 10^{13}$ |

During annealing (heating) process, the hillocks and the like will occur due to the aluminum atoms moving along the grain boundaries by the thermal stress produced by a difference in thermal expansion coefficient between the glass substrate 302 and the pure Al layer 306. The feature of the present invention is to interpose a barrier Al layer 304 between the glass substrate 302 and the pure Al layer 306, wherein the thermal expansion coefficient of the barrier Al layer 304 is larger than thermal expansion coefficient (that) of the glass substrate 302, but smaller than that of the pure Al layer 306. Therefore, the barrier Al layer 304 functions as a buffering layer for preventing the Al atoms migration along the grain boundaries to form the hillock and the like. Also, to obtain a considerably low resistivity (electric resistance) and a good profile of the device which has been gone through the post procedures (such as etching process), the pure Al layer 306 is physically thicker than the barrier Al layer 304.

The experiments are conducted to investigate the conditions of the hillock-free device of the first embodiment of the present invention. First, a sputtering pure aluminum targets mounted in a vacuum chamber of a sputtering apparatus. The aluminum nitride (AlNx) films were grown by reactive sputtering of an aluminum target in a nitrogen/argon (N2/Ar) gas mixture for different values of the deposition parameters: total pressure, nitrogen content in the discharge gas, and substrate bias voltage. Similarly, the aluminum oxide (AlOx) films were grown by reactive sputtering of an aluminum target in an oxygen/argon (O2/Ar) gas mixture, and the aluminum oxide-nitride (AlOxNy) films were grown in a nitrogen/oxygen/argon (N2/O2/Ar) gas mixture.

Then, the stacked structure comprising two Al layers is heated (annealed) at a temperature of 340☐ for 30 minutes. Afterward, the uppermost layer of the stacked structure is observed by scanning electron microscopy (SEM) after annealing process, to see if any hillock and the like occur and the sectional profile of the structure is good. The results are shown in Table 2.

TABLE 2

| Example | Barrier Al layer thickness (Å) | Pure Al layer thickness (Å) | Ratio of Barrier Al layer/ Pure Al layer | Occurrences of hillocks after annealing | Sectional profile of the stacked structure |
|---|---|---|---|---|---|
| 1 | 0 | 2000 | 0 | Yes | — |
| 2 | 200 | 2000 | 1:10 | Yes | Not well |
| 3 | 300 | 2000 | 1:6.7 | Yes | Not well |
| 4 | 400 | 2000 | 1:5 | No | good |
| 5 | 500 | 2000 | 1:4 | No | good |
| 6 | 600 | 2000 | 1:3.3 | No | good |
| 7 | 1000 | 2000 | 1:2 | No | good |
| 8 | 1500 | 2000 | 1:1.3 | No | Not well |
| 9 | 2000 | 2000 | 1:1 | No | Not well |
| 10 | 250 | 1800 | 1:7.2 | Yes | Not well |
| 11 | 300 | 1800 | 1:6 | No | good |
| 12 | 900 | 1800 | 1:2 | No | good |
| 13 | 1800 | 1800 | 1:1 | No | Not well |
| 14 | 300 | 2500 | 1:8.3 | Yes | Not well |
| 15 | 400 | 2500 | 1:6.25 | No | good |
| 16 | 600 | 2500 | 1:4.2 | No | good |
| 17 | 700 | 2500 | 1:3.6 | No | good |
| 18 | 1250 | 2500 | 1:2 | No | good |
| 19 | 2500 | 2500 | 1:1 | No | Not well |
| 20 | 600 | 4500 | 1:7.5 | Yes | Not well |
| 21 | 750 | 4500 | 1:6 | No | good |
| 22 | 1500 | 4500 | 1:3 | No | good |
| 23 | 2250 | 4500 | 1:2 | No | good |
| 24 | 4500 | 4500 | 1:1 | No | Not well |

EXAMPLE 1

Comparative Example

Under the sputtering conditions of film formation pressure of 0.3 Pa and Ar gas, a pure Al film having a thickness of 2000 Å is formed on the glass substrate. Thereafter, the structure is annealed at a temperature of 340☐ for 30 minutes. Then, it is observed by scanning electron microscopy (SEM) after annealing process.

The result shows that the hillocks and the like occur if no other buffering layer exists.

EXAMPLE 2

First, a barrier Al film which is made of the aluminum nitride having a thickness of 200 Å is formed by reactive sputtering on the glass substrate under a film formation pressure of 0.5 Pa. A pure Al film having a thickness of 2000 Å is formed on the barrier Al film under a film formation pressure of 0.3 Pa. The thickness ratio of the barrier Al layer to the pure Al layer is about 1:10. Thus, the stacked structure including: pure Al layer (2000 Å)/AlNx (200 Å)/substrate, is annealed at a temperature of 340☐ for 30 minutes and then observed by SEM, respectively.

The results show that the hillocks and the like still occur. The thickness ratio of the barrier Al layer to the pure Al layer (1:10) is too low to buffer the thermal stress between the glass substrate and Al atoms. Also, after conducting the subsequent processes (such as photolithography and etching), the barrier Al layers are over-etched and the sectional profiles of these stacked structures are not well.

EXAMPLE 3

The procedures of Example 2 is followed to produced the stacked structures having a barrier Al layer (AlNx) in a thickness of 300 Å on a glass substrate and a pure Al layer in a thickness of 2000 Å over the barrier Al layer. The thickness ratio of the barrier Al layer to the pure Al layer is about 1:6.7.

The stacked structures are annealed at a temperature of 340☐ for 30 minutes and then observed by SEM. The results indicate that hillocks and the like are still raised. The thickness ratio of the barrier Al layer to the pure Al layer (1:6.7) is still too low to buffer the thermal stress between the glass substrate and Al atoms. Also, after conducting the subsequent processes (such as photolithography and etching), the barrier Al layers are over-etched and the sectional profiles of these stacked structures are not well.

EXAMPLE 4

The procedures of Example 2 is followed to produced the stacked structures having a barrier Al layer in a thickness of 400 Å on a glass substrate and a pure Al layer in a thickness of 2000 Å over the barrier Al layer. The thickness ratio of the barrier Al layer to the pure Al layer is about 1:5.

The stacked structures including: pure Al layer (2000 Å)/AlNx (400 Å)/substrate is annealed at a temperature of 340☐ for 30 minutes and then observed by SEM, respectively.

The results indicate that no hillocks and the like occur after annealing. The thermal stress between the glass substrate and Al atoms can be effectively buffered if the thickness ratio of the barrier Al layer to the pure Al layer is 1:5. Also, after conducting the subsequent processes (such as photolithography and etching), the sectional profiles of these stacked structures are good.

EXAMPLE 5

The procedures of Example 2 is followed to produced the stacked structures having a barrier Al layer in a thickness of 500 Å on a glass substrate and a pure Al layer in a thickness of 2000 Å over the barrier Al layer. The thickness ratio of the barrier Al layer to the pure Al layer is about 1:4. These stacked structures are annealed at a temperature of 340☐ for 30 minutes and then observed by SEM, respectively.

The results indicate that the hillocks and the like are effectively inhibited and the sectional profiles of the structures are good.

EXAMPLE 6

The procedures of Example 2 is followed to produced the stacked structures having a barrier Al layer in a thickness of 600 Å on a glass substrate and a pure Al layer in a thickness of 2000 Å over the barrier Al layer. The thickness ratio of the barrier Al layer to the pure Al layer is about 1:3.3. These stacked structures are annealed at a temperature of 340☐ for 30 minutes and then observed by SEM, respectively.

The results indicate that the hillocks and the like are effectively inhibited and the sectional profiles of the structures are good.

EXAMPLE 7

The procedures of Example 2 is followed to produced the stacked structures having a barrier Al layer in a thickness of 1000 Å on a glass substrate and a pure Al layer in a thickness of 2000 Å over the barrier Al layer. The thickness ratio of the barrier Al layer to the pure Al layer is about 1:2. These stacked structures are annealed at a temperature of 340☐ for 30 minutes and then observed by SEM, respectively.

The results indicate that the hillocks and the like are effectively inhibited and the sectional profiles of the structures are good.

EXAMPLE 8

The procedures of Example 2 is followed to produced the stacked structures having a barrier Al layer in a thickness of 1500 Å on a glass substrate and a pure Al layer in a thickness of 2000 Å over the barrier Al layer. The thickness ratio of the barrier Al layer to the pure Al layer is about 1:1.3. These stacked structures are annealed at a temperature of 340☐ for 30 minutes and then observed by SEM, respectively.

The results indicate that the hillocks and the like are effectively inhibited. However, the sectional profiles of the structures are not well. The pure Al layer is over-etched and the barrier Al layer is under-etched, thereby leaving the barrier Al layer to excess.

EXAMPLE 9

The procedures of Example 2 is followed to produced the stacked structures having a barrier Al layer in a thickness of 2000 Å on a glass substrate and a pure Al layer in a thickness of 2000 Å over the barrier Al layer. The thickness ratio of the barrier Al layer to the pure Al layer is about 1:1. These stacked structures are annealed at a temperature of 340☐ for 30 minutes and then observed by SEM, respectively.

The results indicate that the hillocks and the like are effectively inhibited. However, the sectional profiles of the structures are not well. The pure Al layer is over-etched and the barrier Al layer is under-etched, thereby leaving the barrier Al layer to excess.

EXAMPLE 10

The procedures of Example 2 is followed to produced the stacked structures having a barrier Al layer in a thickness of 250 Å on a glass substrate and a pure Al layer in a thickness of 1800 Å over the barrier Al layer. The thickness ratio of the barrier Al layer to the pure Al layer is about 1:7.2. These stacked structures are annealed at a temperature of 340☐ for 30 minutes and then observed by SEM, respectively.

The results indicate that hillocks and the like are still raised. The thickness ratio of the barrier Al layer to the pure Al layer (1:7.2) is too low to buffer the thermal stress between the glass substrate and Al atoms. Also, the barrier Al layers are over-etched and the sectional profiles of these stacked structures are not well.

EXAMPLE 11

The procedures of Example 2 is followed to produced the stacked structures having a barrier Al layer in a thickness of 300 Å on a glass substrate and a pure Al layer in a thickness of 1800 Å over the barrier Al layer. The thickness ratio of the barrier Al layer to the pure Al layer is about 1:6. These stacked structures are annealed at a temperature of 340☐ for 30 minutes and then observed by SEM, respectively.

The results indicate that the hillocks and the like are effectively inhibited and the sectional profiles of the structures are good.

EXAMPLE 12

The procedures of Example 2 is followed to produced the stacked structures having a barrier Al layer in a thickness of 900 Å on a glass substrate and a pure Al layer in a thickness of 1800 Å over the barrier Al layer. The thickness ratio of the barrier Al layer to the pure Al layer is about 1:2. These stacked structures are annealed at a temperature of 340☐ for 30 minutes and then observed by SEM, respectively.

The results indicate that the hillocks and the like are effectively inhibited and the sectional profiles of the structures are good.

EXAMPLE 13

The procedures of Example 2 is followed to produced the stacked structures having a barrier Al layer in a thickness of 1800 Å on a glass substrate and a pure Al layer in a thickness of 1800 Å over the barrier Al layer. The thickness ratio of the barrier Al layer to the pure Al layer is about 1:1. These stacked structures are annealed at a temperature of 340☐ for 30 minutes and then observed by SEM, respectively.

The results indicate that the hillocks and the like are effectively inhibited. However, the sectional profiles of the structures are not well. The pure Al layer is over-etched and the barrier Al layer is under-etched, thereby leaving the barrier Al layer to excess.

EXAMPLE 14

The procedures of Example 2 is followed to produced the stacked structures having a barrier Al layer in a thickness of 300 Å on a glass substrate and a pure Al layer in a thickness of 2500 Å over the barrier Al layer. The thickness ratio of the barrier Al layer to the pure Al layer is about 1:8.3. These stacked structures are annealed at a temperature of 340☐ for 30 minutes and then observed by SEM, respectively.

The results indicate that hillocks and the like are still raised. The thickness ratio of the barrier Al layer to the pure Al layer (1:8.3) is too low to buffer the thermal stress between the glass substrate and Al atoms. Also, the barrier Al layers are over-etched and the sectional profiles of these stacked structures are not well.

EXAMPLE 15

The procedures of Example 2 is followed to produced the stacked structures having a barrier Al layer in a thickness of 400 Å on a glass substrate and a pure Al layer in a thickness of 2500 Å over the barrier Al layer. The thickness ratio of the barrier Al layer to the pure Al layer is about 1:6.25. These stacked structures are annealed at a temperature of 340□ for 30 minutes and then observed by SEM, respectively.

The results indicate that the hillocks and the like are effectively inhibited and the sectional profiles of the structures are good.

EXAMPLE 16

The procedures of Example 2 is followed to produced the stacked structures having a barrier Al layer in a thickness of 600 Å on a glass substrate and a pure Al layer in a thickness of 2500 Å over the barrier Al layer. The thickness ratio of the barrier Al layer to the pure Al layer is about 1:4.2. These stacked structures are annealed at a temperature of 340□ for 30 minutes and then observed by SEM, respectively.

The results indicate that the hillocks and the like are effectively inhibited and the sectional profiles of the structures are good.

EXAMPLE 17

The procedures of Example 2 is followed to produced the stacked structures having a barrier Al layer in a thickness of 700 Å on a glass substrate and a pure Al layer in a thickness of 2500 Å over the barrier Al layer. The thickness ratio of the barrier Al layer to the pure Al layer is about 1:3.6. These stacked structures are annealed at a temperature of 340□ for 30 minutes and then observed by SEM, respectively.

The results indicate that the hillocks and the like are effectively inhibited and the sectional profiles of the structures are good.

EXAMPLE 18

The procedures of Example 2 is followed to produced the stacked structures having a barrier Al layer in a thickness of 1250 Å on a glass substrate and a pure Al layer in a thickness of 2500 Å over the barrier Al layer. The thickness ratio of the barrier Al layer to the pure Al layer is about 1:2. These stacked structures are annealed at a temperature of 340□ for 30 minutes and then observed by SEM, respectively.

The results indicate that the hillocks and the like are effectively inhibited and the sectional profiles of the structures are good.

EXAMPLE 19

The procedures of Example 2 is followed to produced the stacked structures having a barrier Al layer in a thickness of 2500 Å on a glass substrate and a pure Al layer in a thickness of 2500 Å over the barrier Al layer. The thickness ratio of the barrier Al layer to the pure Al layer is about 1:1. These stacked structures are annealed at a temperature of 340□ for 30 minutes and then observed by SEM, respectively.

The results indicate that the hillocks and the like are effectively inhibited. However, the sectional profiles of the structures are not well. The pure Al layer is over-etched and the barrier Al layer is under-etched, thereby leaving the barrier Al layer to excess.

EXAMPLE 20

The procedures of Example 2 is followed to produced the stacked structures having a barrier Al layer in a thickness of 600 Å on a glass substrate and a pure Al layer in a thickness of 4500 Å over the barrier Al layer. The thickness ratio of the barrier Al layer to the pure Al layer is about 1:7.5. These stacked structures are annealed at a temperature of 340□ for 30 minutes and then observed by SEM, respectively.

The results indicate that hillocks and the like are still raised. The thickness ratio of the barrier Al layer to the pure Al layer (1:7.5) is too low to buffer the thermal stress between the glass substrate and Al atoms. Also, the barrier Al layers are over-etched and the sectional profiles of these stacked structures are not well.

EXAMPLE 21

The procedures of Example 2 is followed to produced the stacked structures having a barrier Al layer in a thickness of 750 Å on a glass substrate and a pure Al layer in a thickness of 4500 Å over the barrier Al layer. The thickness ratio of the barrier Al layer to the pure Al layer is about 1:6. These stacked structures are annealed at a temperature of 340□ for 30 minutes and then observed by SEM, respectively.

The results indicate that the hillocks and the like are effectively inhibited and the sectional profiles of the structures are good.

EXAMPLE 22

The procedures of Example 2 is followed to produced the stacked structures having a barrier Al layer in a thickness of 1500 Å on a glass substrate and a pure Al layer in a thickness of 4500 Å over the barrier Al layer. The thickness ratio of the barrier Al layer to the pure Al layer is about 1:3. These stacked structures are annealed at a temperature of 340□ for 30 minutes and then observed by SEM, respectively.

The results indicate that the hillocks and the like are effectively inhibited and the sectional profiles of the structures are good.

EXAMPLE 23

The procedures of Example 2 is followed to produced the stacked structures having a barrier Al layer in a thickness of 2250 Å on a glass substrate and a pure Al layer in a thickness of 4500 Å over the barrier Al layer. The thickness ratio of the barrier Al layer to the pure Al layer is about 1:2. These stacked structures are annealed at a temperature of 340□ for 30 minutes and then observed by SEM, respectively.

The results indicate that the hillocks and the like are effectively inhibited and the sectional profiles of the structures are good.

EXAMPLE 24

The procedures of Example 2 is followed to produced the stacked structures having a barrier Al layer in a thickness of 4500 Å on a glass substrate and a pure Al layer in a thickness of 4500 Å over the barrier Al layer. The thickness ratio of the barrier Al layer to the pure Al layer is about 1:1. These stacked structures are annealed at a temperature of 340□ for 30 minutes and then observed by SEM, respectively.

The results indicate that the hillocks and the like are effectively inhibited. However, the sectional profiles of the structures are not well. The pure Al layer is over-etched and the barrier Al layer is under-etched, thereby leaving the barrier Al layer to excess.

The results of Examples 1~24 show that the hillock-free conductive layer comprises at least two aluminum (Al) layers formed on a substrate, including a barrier Al layer formed on the substrate and a pure Al layer formed on the barrier Al layer, wherein the pure Al layer has a thickness ranged between about 1000 angstrom and 4500 angstrom, and the thickness ratio of the barrier Al layer to the pure Al layer is in the range between about 1:6.25 and 1:1. Therefore, the thermal stress produced in accordance with the difference in the thermal expansion between the glass substrate and pure Al layer is effectively buffered. Also, in the first embodiment, materials used as the barrier Al layer could be aluminum nitride (AlNx), aluminum oxide (AlOx) and aluminum oxide-nitride (AlOxNy).

Moreover, the results of Examples listed in Table 2 show that the sectional profiles of these stacked structures are good if the pure Al layer has a thickness ranged between about 1000 angstrom and 4500 angstrom, and the barrier Al layer is physically thinner than the pure Al layer, and more particularly, the thickness ratio of the barrier Al layer to the pure Al layer is in the range between about 1:6.25 and 1:2.

Although there is only one pure Al layer is demonstrated above, it is to be understood that the present invention is not restricted thereto. The occurrences of the hillocks and the like are still effectively prevented even multiple (two, three, four, five, and so on) pure Al layers are formed above the barrier Al layer. In the practical application, the pure Al layer(s) could be substituted with the Al-based layer(s), such as Al—Cu, Al—Cu—Si, Al—Pd, and Al—Cr, Al—Ti, and so on. Additionally, the barrier Al layer may contains multiple layers. For example, the barrier Al layer could comprise a first AlNx layer, a second AlNx layer and a third AlNx layer which contain different amounts of nitrogen; or could comprise a first AlOx layer, a second AlOx layer and a third AlOx layer which contain different amounts of oxygen; or could comprise a first AlOxNy layer, a second AlOxNy layer and a third AlOxNy layer which contain different ratio of oxygen to nitrogen. Also, the barrier Al layer could comprise multiple layers with different chemical compounds; for example, AlNx layer/AlOx layer, or AlNx layer/AlOxNy layer, or AlOx layer/AlOxNy layer, or AlNx layer/AlOx layer/ AlOxNy layer.

Second Embodiment

In the second embodiment, an aluminum-neodymium (Al—Nd) alloy layer is used as the barrier Al layer for preventing the occurrence of hillocks and the like. This stacked structure has often employed as the electrode pattern of thin film transistor (TFT).

Please also refer to FIG. 3. In the second embodiment, a glass substrate 304 is provided, and an Al—Nd alloy layer (as the barrier Al layer 304) is formed over the substrate 304. The Al—Nd alloy layer has a thickness ranged between about 100 angstrom and 4000 angstrom, and preferably in a thickness of about 300 angstrom and 900 angstrom.

Then, a pure Al layer 306 is formed over the Al—Nd alloy layer. The pure Al layer has a thickness ranged between about 500 angstrom and 4500 angstrom, and preferably in a thickness of about 1500 angstrom and 3000 angstrom.

The film formation condition of the Al—Nd alloy layer and the pure Al layer 306 are not in the limitation. The general film formation pressure, such as 0.3 Pa or 0.4 Pa, could be adapted. The Al—Nd alloy layer releases the stress produced during the thermal processes, so that the hillocks could be effectively inhibited.

Additionally, a protective layer (not shown in FIG. 3), for preventing the oxidation of the Al layer, could be further formed over the pure Al layer 306. Metal such as molybdenum (Mo) and titanium (Ti), and compound molybdenum nitride (MoN) could be used as the material of the protective layer.

The experiments are conducted to investigate the conditions of the hillock-free device of the second embodiment of the present invention. Similarly, the stacked structure (comprising an Al—Nd alloy layer on the substrate and a pure Al layer on the Al—Nd alloy layer) is annealed at a temperature of 320□ for 10 minutes. Afterward, the uppermost layer of the stacked structure is observed by scanning electron microscopy (SEM) after annealing process to see if any hillock and the like occur. Also, a Mo layer is further formed over the pure Al layer as a protective layer, and the sectional profile of the structure is observed by SEM. The results are shown in Table 3.

TABLE 3

| Example | Al—Nd alloy layer thickness (Å) | Pure Al layer thickness (Å) | Ratio of Al—Nd alloy layer to Pure Al layer | Occurrences of hillocks after annealing | Sectional profile of the stacked structure |
|---|---|---|---|---|---|
| 25 | 0 | 2000 | 0 | Yes | — |
| 26 | 1800 | 0 | — | No | good |
| 27 | 300 | 1000 | 1:3.3 | No | good |
| 28 | 300 | 2000 | 1:6.7 | No | good |
| 29 | 450 | 2000 | 1:4.4 | No | good |
| 30 | 450 | 1000 | 1:2.2 | No | good |
| 31 | 900 | 2000 | 1:2.2 | No | good |
| 32 | 900 | 1000 | 1:1.1 | No | good |
| 33 | 1800 | 2000 | 1:1.1 | No | good |
| 34 | 1800 | 1000 | 1:0.55 | No | good |

EXAMPLE 25

Comparative Example

Under the sputtering conditions of film formation pressure of 0.3 Pa, a pure Al film having a thickness of 2000 Å is formed on the substrate. Thereafter, the structure is annealed at a temperature of 320□ for 10 minutes. Then, it is observed by scanning electron microscopy (SEM) after annealing process.

The result shows that the hillocks and the like occur if only pure Al layer is employed.

EXAMPLE 26 (Comparative Example)

Under the sputtering conditions of film formation pressure of 0.3 Pa, an Al—Nd alloy film having a thickness of 1800 Å is formed on the substrate. Thereafter, the structure is annealed at a temperature of 320☐ for 10 minutes. Then, it is observed by scanning electron microscopy (SEM) after annealing process.

The result shows that no hillocks occur if only Al—Nd alloy layer is used as the conductive layer.

Also, a metallic Mo layer is further formed on the Al—Nd alloy layer in a thickness of 1000 Å. Under SEM, it shows that the structure has a good sectional profile.

However, material of Al—Nd alloy is expansive, it is less beneficial to use the Al—Nd alloy as the only material of the conductive layer. Also, the electric resistance for Al—Nd alloy is too high (about twice the value for Al), and more film formation time is needed for forming the thicker film in order to meet the electric requirement of the device.

EXAMPLE 27

Under the sputtering conditions of film formation pressure of 0.3 Pa, an Al—Nd alloy film having a thickness of 300 Å is formed on the substrate, and then a pure Al layer having a thickness of 1000 Å is formed on the Al—Nd alloy film. Thereafter, the structure is annealed at a temperature of 320☐ for 10 minutes. Then, it is observed by scanning electron microscopy (SEM) after annealing process. The result shows no occurrence of hillocks and the like.

Also, a metallic Mo layer is further formed on the pure Al layer in a thickness of 900 Å. Under SEM, it shows that the structure has a good sectional profile.

EXAMPLE 28

An Al—Nd alloy film having a thickness of 300 Å is formed on the substrate (film formation pressure of 0.3 Pa), and then a pure Al layer having a thickness of 2000 Å is formed on the Al—Nd alloy film. Thereafter, the structure is annealed at a temperature of 320☐ for 10 minutes. Then, it is observed by scanning electron microscopy (SEM) after annealing process. The result also shows no occurrence of hillocks and the like.

A metallic Mo layer is further formed on the pure Al layer in a thickness of 900 Å. Under SEM, it shows that the structure has a good sectional profile.

EXAMPLE 29

An Al—Nd alloy film having a thickness of 450 Å is formed on the substrate (film formation pressure of 0.3 Pa), and then a pure Al layer having a thickness of 2000 Å is formed on the Al—Nd alloy film. Thereafter, the structure is annealed at a temperature of 320☐ for 10 minutes. Then, it is observed by scanning electron microscopy (SEM) after annealing process. The result also shows no occurrence of hillocks and the like.

A metallic Mo layer is further formed on the pure Al layer in a thickness of 900 Å. Under SEM, it shows that the structure has a good sectional profile.

EXAMPLE 30

An Al—Nd alloy film having a thickness of 450 Å is formed on the substrate (film formation pressure of 0.3 Pa), and then a pure Al layer having a thickness of 1000 Å is formed on the Al—Nd alloy film. The structure is annealed at a temperature of 320☐ for 10 minutes, and then observed by scanning electron microscopy (SEM). The result also shows no occurrence of hillocks and the like.

A metallic Mo layer is further formed on the pure Al layer in a thickness of 900 Å. Under SEM, it shows that the structure has a good sectional profile.

EXAMPLE 31

An Al—Nd alloy film having a thickness of 900 Å is formed on the substrate, and then a pure Al layer having a thickness of 2000 Å is formed on the Al—Nd alloy film. The structure is annealed at a temperature of 320☐ for 10 minutes, and then observed by scanning electron microscopy (SEM). The result also shows no occurrence of hillocks and the like.

A metallic Mo layer is further formed on the pure Al layer in a thickness of 900 Å. Under SEM, it shows that the structure has a good sectional profile.

EXAMPLE 32

An Al—Nd alloy film having a thickness of 900 Å is formed on the substrate, and then a pure Al layer having a thickness of 1000 Å is formed on the Al—Nd alloy film. The structure is annealed at a temperature of 320☐ for 10 minutes, and then observed by scanning electron microscopy (SEM). The result also shows no occurrence of hillocks and the like.

A metallic Mo layer is further formed on the pure Al layer in a thickness of 900 Å. Under SEM, it shows that the structure has a good sectional profile.

EXAMPLE 33

An Al—Nd alloy film having a thickness of 1800 Å is formed on the substrate, and then a pure Al layer having a thickness of 2000 Å is formed on the Al—Nd alloy film. The structure is annealed at a temperature of 320☐ for 10 minutes, and then observed by scanning electron microscopy (SEM). The result also shows no occurrence of hillocks and the like.

A metallic Mo layer is further formed on the pure Al layer in a thickness of 900 Å. Under SEM, it shows that the structure has a good sectional profile.

EXAMPLE 34

An Al—Nd alloy film having a thickness of 1800 Å is formed on the substrate, and then a pure Al layer having a thickness of 1000 Å is formed on the Al—Nd alloy film. The thickness ratio of the Al—Nd alloy layer to the pure Al layer is about 1:0.55. The structure is annealed at a temperature of 320☐ for 10 minutes, and then observed by scanning electron microscopy (SEM). The result also shows no occurrence of hillocks and the like.

A metallic Mo layer is further formed on the pure Al layer in a thickness of 900 Å. Under SEM, it shows that the structure has a good sectional profile.

It is noted that the pure Al layer is generally thicker than the Al—Nd alloy (barrier layer) in the second embodiment (Examples 27-33); however, the pure Al layer can be thinner than the Al—Nd alloy layer (Example 34) for effectively preventing hillocks and the like.

According to the results of Examples 27~34, an Al—Nd alloy layer interposed between the substrate and the pure Al layer does effectively prevent the occurrence of hillocks and the like.

The results of Examples 27~34 show that the conductive layer comprises at least two aluminum (Al) layers formed on a substrate, including a barrier Al (Al—Nd alloy) layer formed on the substrate and a pure Al layer formed on the barrier Al layer, wherein the barrier Al layer has a thickness ranged between about 300 angstrom and 1800 angstrom, the pure Al layer has a thickness ranged between about 1000 angstrom and 2000 angstrom. The thickness ratio of the barrier Al layer to the pure Al layer is in the range between about 1:6.67 and 1:0.55. Therefore, the thermal stress produced in accordance with the difference in the thermal expansion between the glass substrate and pure Al layer is effectively buffered. Accordingly, for preventing the occurrence of hillocks and keeping good sectional profiles of these stacked structures, the Al—Nd alloy layer has a thickness ranged between about 100 angstrom and 4000 angstrom, and preferably in a range of about 300 angstrom and 900 angstrom. The pure Al layer has a thickness ranged between about 500 angstrom and 4500 angstrom, and preferably in a range of about 1500 angstrom and 3000 angstrom.

In the practical application, most of the stacked structure (Examples 27-33) according to the second embodiment of the invention could comprise a very thick pure Al layer and a very thin Al—Nd alloy layer in the consideration of production cost. For example, the cost for the structure comprising 450 Å Al—Nd alloy layer and 2000 Å pure Al layer is 66% of the cost for the structure only comprising 1800 Å Al—Nd alloy layer. Moreover, the electric resistance of Al is lower than that of Al—Nd alloy (about 50%). Thus, the device requirement can be satisfied by using the thinner complex film of AlNd/Al, thereby decreasing the size and improving the evenness of the device.

Figure 4:
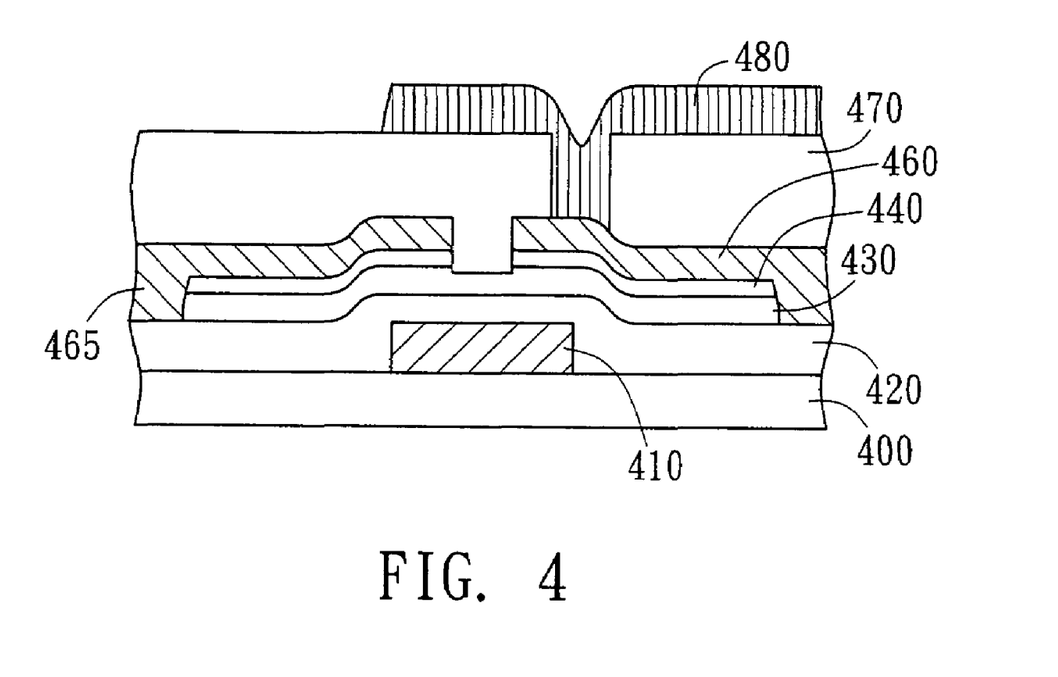
FIG. 4 is a cross-sectional view of a bottom gate of TFT according to the embodiments of the invention.

The structure according to the embodiments of the invention can be used as a conduct pattern such as a wiring pattern or an electrode pattern of an electronic device. In the following description, the structure of the invention is used as the metallic gate electrode of a thin film transistor (TFT). FIG. 4 is a cross-sectional view of a bottom gate of TFT according to the embodiments of the invention. First, a substrate 400 is provided. A conductive layer is deposited over the substrate 400, and etched to form a gate electrode 410.

According to the first embodiment of the invention, the gate electrode 410 comprises at least two Al layers, including a barrier Al layer on the substrate 400 and a pure Al layer on the barrier Al layer. The barrier Al layer at least contains one compound of aluminum nitride (AlNx), aluminum oxide (AlOx) and aluminum oxide-nitride (AlOxNy). The thickness ratio of the barrier Al layer to the pure Al layer is in the range between about 1:6.25 and 1:2, in order to obtain a good sectional profile after the device is etched. Also, a Mo layer, or a MoN layer can be further formed on the pure Al layer, in a thickness ranged from 300 Å to 1200 Å, for the purpose of protection.

According to the second embodiment of the invention, the gate electrode 410 comprises at least two Al layers, including an Al—Nd alloy layer on the substrate 400 and a pure Al layer on the Al—Nd alloy layer. The Al—Nd alloy layer has a thickness ranged between about 100 Å and 4000 Å, and preferably in a thickness of about 300 Å and 900 Å. The pure Al layer has a thickness ranged between about 500 Å and 4500 Å, and preferably in a thickness of about 1500 Å and 3000 Å. The thickness ratio of the barrier Al layer to the pure Al layer is in the range between about 1:6.67 and 1:0.55. Similarly, a Mo layer, or a MoN layer can be further formed on the pure Al layer, in a thickness ranged from 300 Å to 1200 Å, for the purpose of protection.

Afterward, a gate insulating layer 420 is formed over the gate electrode 410. By deposition and photolithography, an amorphous silicon layer 430 and an ohmic contact layer 440 are then formed on the gate insulating layer 420.

Next, a source region 460 and a drain region 465 are formed by depositing and patterning a metal (such as Cr and Al) layer over the substrate 400. Also, a channel region is also formed to expose the surface of the amorphous silicon layer 430, wherein the source region 460 and the drain region 465 are divided by the channel.

Afterward, a passivation layer 470 is formed over the substrate 400 for covering the source region 460, the drain region 465 and the channel. By photolithography and etching, an opening is formed in the passivation layer 470 to expose the drain region 460. Finally, a patterned transparent electrode (ITO) 380 is formed over the passivation layer 470, and the opening is also filled with the transparent electrode.

It is, of course, understood that the invention could be applied in varied electronic devices, not limited in the application of TFT device. According to the stacked structure of the invention, the production cost can be considerably reduced, and hillocks and the like can be effectively inhibited. Also, the electric resistance of the Al layer combination (a barrier layer under a pure Al layer) is much lower than that of only one Al-based layer (such as an Al—Nd alloy layer), thereby improving the electric characteristics of the applied device.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, at least comprising a conductive pattern formed on a substrate, wherein the conductive pattern comprises:
    a substantially pure aluminum layer formed on the substrate; and
    a barrier aluminum layer formed between the substantially pure aluminum layer and the substrate;
    wherein the barrier aluminum layer contains at least one compound selected from the group consisting of aluminum oxide (AlOx) and aluminum oxide-nitride (AlOxNy); and
    wherein the thickness ratio of the barrier aluminum layer to the substantially pure aluminum layer is in the range between 1: 6.25 and about 1:2.

2. The electronic device according to claim 1, wherein the aluminum of the substantially pure aluminum layer is at least about 99.0 wt %.

3. The electronic device according to claim 1, wherein the substantially pure aluminum layer has a thickness ranging between about 1000 angstrom and about 4500 angstrom.

4. An electronic device, at least comprising a conductive pattern formed on a substrate, wherein the conductive pattern comprises:
    a substantially pure aluminum layer formed on the substrate; and
    an aluminum-neodymium (Al—Nd) alloy layer formed between the substantially pure aluminum layer and the substrate;

wherein the Al—Nd alloy layer has a thickness ranging between about 100 angstrom and about 4000 angstrom.

5. The electronic device according to claim 4, wherein the aluminum of the substantially pure aluminum layer is at least about 99.0 wt %.

6. The electronic device according to claim 4, wherein the thickness ratio of the Al—Nd alloy layer to the substantially pure aluminum layer is in the range between about 1:6.67 and about 1:0.55.

7. The electronic device according to claim 4, wherein the substantially pure aluminum layer has a thickness ranging between about 500 angstrom and about 4500 angstrom.

8. The electronic device according to claim 4, wherein the Al—Nd alloy layer is in a thickness of about 300 angstrom and about 900 angstrom, and the substantially pure aluminum layer is in a thickness of about 1500 angstrom and about 3000 angstrom.

9. The electronic device according to claim 4, wherein a protective layer is further formed on the substantially pure aluminum layer.

10. The electronic device according to claim 9, wherein the protective layer is made of material comprising molybdenum (Mo), or molybdenum nitride (MoN), or titanium (Ti), or alloy containing Mo, or MoN or Ti.

11. A thin film transistor device formed on a substrate, comprising:
    a source region and a drain region;
    a channel region formed between the source region and the drain region;
    a gate electrode formed adjacent to the channel region; and
    an insulating layer formed between the gate electrode and the channel region;
    wherein each of the gate electrode, the source region and the drain region comprises a metal layer, and at least one of the metal layers, which comprises a substantially pure aluminum layer, is closer to the substrate than the others,
    wherein an aluminum-neodymium (Al—Nd) alloy layer is further formed between the substantially pure aluminum layer and the substrate, and the Al—Nd alloy layer has a thickness ranging between about 100 angstrom and about 4000 angstrom.

12. The thin film transistor device according to claim 11, wherein the aluminum of the substantially pure aluminum layer is at least about 99.0 wt %.

13. The thin film transistor device according to claim 11, wherein the thickness ratio of the Al—Nd alloy layer to the substantially pure aluminum layer is in the range between about 1:6.67 and about 1:0.55.

14. The thin film transistor device according to claim 11, wherein the substantially pure aluminum layer has a thickness ranging between about 500 angstrom and about 4500 angstrom.

15. The thin film transistor device according to claim 11, wherein the Al—Nd alloy layer is in a thickness of about 300 angstrom and about 900 angstrom, and the substantially pure aluminum layer is in a thickness of about 1500 angstrom and about 3000 angstrom.

16. The thin film transistor device according to claim 11, wherein a protective layer is further formed on the substantially pure aluminum layer.

17. The thin film transistor device according to claim 16, wherein the protective layer is made of material comprising molybdenum (Mo), or molybdenum nitride (MoN), or titanium (Ti), or alloy containing Mo, or MoN or Ti.

18. An electronic device, at least comprising a conductive pattern formed on
    a substrate, wherein the conductive pattern comprises:
    a substantially pure aluminum layer formed on the substrate; and
    a barrier aluminum layer formed between the substantially pure aluminum layer and the substrate;
    wherein the barrier aluminum layer contains at least one compound selected from the group consisting of aluminum oxide (AlOx) and aluminum oxide-nitride (AlOxNy); and
    wherein the substantially pure aluminum layer has a thickness ranging between about 1000 angstrom and about 4500 angstrom.

19. An electronic device, at least comprising a conductive pattern formed on a substrate, wherein the conductive pattern comprises:
    a substantially pure aluminum layer formed on the substrate; and
    an aluminum oxide-nitride (AlOxNy) layer formed between the substantially pure aluminum layer and the substrate;
    wherein a thickness ratio of the aluminum oxide-nitride layer to the substantially pure aluminum layer is in the range between about 1:6.25 and about 1:2.

* * * * *